US010938386B2

(12) United States Patent
Tachibana

(10) Patent No.: US 10,938,386 B2
(45) Date of Patent: Mar. 2, 2021

(54) CONTROLLER

(71) Applicant: DENSO CORPORATION, Kariya (JP)

(72) Inventor: Yuki Tachibana, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/903,563

(22) Filed: Jun. 17, 2020

(65) Prior Publication Data
US 2020/0395928 A1 Dec. 17, 2020

(30) Foreign Application Priority Data

Jun. 17, 2019 (JP) .............................. JP2019-112298

(51) Int. Cl.
| *B60L 3/00* | (2019.01) |
| *B60L 53/00* | (2019.01) |
| *B60L 58/00* | (2019.01) |
| *H03K 17/0812* | (2006.01) |
| *H01H 9/54* | (2006.01) |
| *H03K 17/081* | (2006.01) |
| *H03K 17/30* | (2006.01) |

(52) U.S. Cl.
CPC ......... *H03K 17/08122* (2013.01); *H01H 9/54* (2013.01); *H03K 17/08104* (2013.01); *H03K 17/30* (2013.01); *H03K 2217/0081* (2013.01)

(58) Field of Classification Search
None
See application file for complete search history.

(56) References Cited

U.S. PATENT DOCUMENTS

| 7,688,606 | B2 * | 3/2010 | Amano | H02H 9/001 |
| | | | | 363/49 |
| 7,746,031 | B2 * | 6/2010 | Ishishita | H01M 10/48 |
| | | | | 320/132 |
| 8,688,317 | B2 * | 4/2014 | Boiron | G01R 31/3278 |
| | | | | 701/33.8 |
| 8,760,093 | B2 * | 6/2014 | Itou | H02P 29/0241 |
| | | | | 318/400.21 |
| 9,738,164 | B2 * | 8/2017 | Min | B60L 50/51 |
| 9,815,375 | B2 * | 11/2017 | Matsuda | B62K 11/04 |
| 10,181,727 | B2 * | 1/2019 | Katano | H02M 3/158 |
| 10,703,221 | B2 * | 7/2020 | Makino | B60L 53/00 |
| 10,787,136 | B2 * | 9/2020 | Takahashi | H02J 7/1423 |

FOREIGN PATENT DOCUMENTS

JP 2016-142141 A 8/2016

* cited by examiner

*Primary Examiner* — Kenneth B Wells
(74) *Attorney, Agent, or Firm* — Oliff PLC

(57) ABSTRACT

A controller for a system includes a first control section and a second control section. The system includes an electrical actuator, a switch switching the electrical actuator between a power supply state and a power cutoff state, and a drive section driving the switch. The drive section outputs, to the switch, a drive signal to drive the switch based on a command signal for switching of the switch. The first control section determines a switch state based on the command signal, and the second control section determines a switch state based on the drive signal. At least one of the first control section and the second control section determines the electrical actuator to be in the power supply state on the condition that the first control section determines the switch to be in the power supply state, and the second control section also determines the switch to be in the power supply state.

6 Claims, 6 Drawing Sheets

US 10,938,386 B2

CONTROLLER

CROSS-REFERENCE TO RELATED APPLICATION

This application is based on and claims the benefit of priority from earlier Japanese Patent Application No. 2019-112298 filed Jun. 17, 2019, the description of which is incorporated herein by reference.

TECHNICAL FIELD

The present disclosure relates to a controller for a system.

BACKGROUND

As described in Japanese Patent Application Publication No. 2016-142141, there has been known a controller to control a switch that switches an electrical actuator, such as a linear solenoid and a motor, between a power supply state and a power cutoff state. The controller monitors and determines a switch state, and determines a state of the electrical actuator based on the determination result of the switch state.

SUMMARY

In a controller for a system according to a first aspect, the controller includes a first control section and a second control section. The system includes an electrical actuator, a switch switching the electrical actuator between a power supply state and a power cutoff state, and a drive section driving the switch. The electrical actuator is in the power supply state when the switch is in one (first state) of an open state and a closed state and in the power cutoff state when the switch is in the other one (second state) of the open and closed states. The drive section outputs, to the switch, a drive signal to drive the switch based on a command signal for switching of the switch. The first control section determines the switch state based on the command signal. The second control section determines the switch state based on the drive signal. At least one of the first control section and the second control section determines the electrical actuator to be in the power supply state on the condition that the first control section determines the switch to be in the first state and the second control section also determines the switch to be in the first state.

DETAILED DESCRIPTION OF THE PREFERRED EMBODIMENTS

Figure 1:
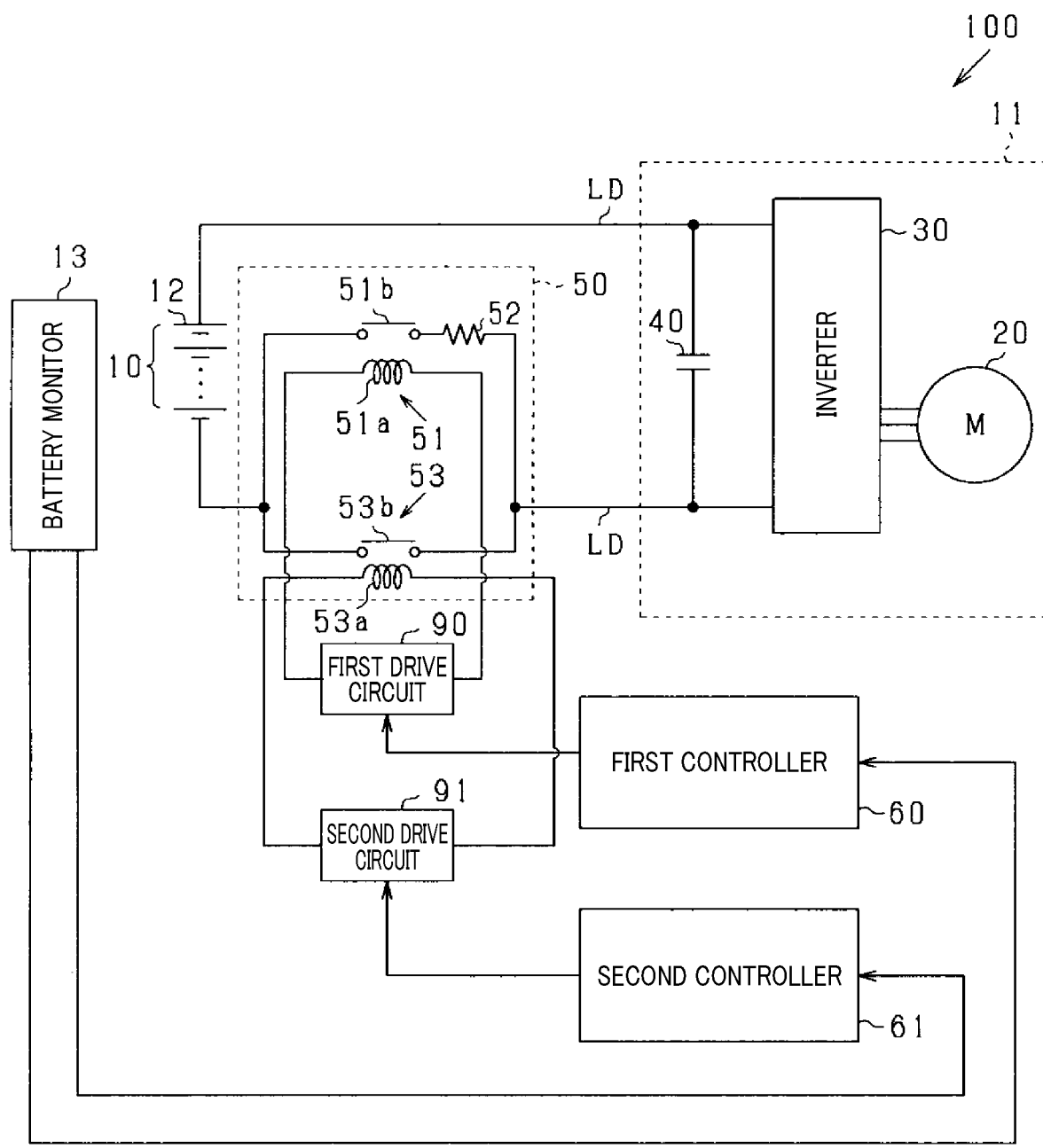
FIG. 1 is a block diagram schematically illustrating a power supply system of a vehicle.

Redundancy may be required for determination of the state of the electrical actuator in order to improve safety. For example, when the controller fails to appropriately monitor a switch state and thus erroneously determines the switch state, the controller cannot appropriately determine the state of the electrical actuator.

An object of the disclosure, which has been made to solve the above problem, is to provide a controller that has redundancy for successfully determining a state of an electrical actuator.

In a controller for a system according to a first aspect, the controller includes a first control section and a second control section. The system includes an electrical actuator, a switch switching the electrical actuator between a power supply state and a power cutoff state, and a drive section driving the switch. The electrical actuator is in the power supply state when the switch is in one (first state) of an open state and a closed state and in the power cutoff state when the switch is in the other one (second state) of the open and closed states. The drive section outputs, to the switch, a drive signal to drive the switch based on a command signal for switching of the switch. The first control section determines the switch state based on the command signal. The second control section determines the switch state based on the drive signal. At least one of the first control section and the second control section determines the electrical actuator to be in the power supply state on the condition that the first control section determines the switch to be in the first state and the second control section also determines the switch to be in the first state. According to the first aspect, the two control sections use the respective different signals to determine the state of the electrical actuator. Hence, even if the second control section fails to appropriately acquire the drive signal due to abnormality in the drive section and thus erroneously determines the switch state, the first control section can appropriately acquire the command signal, and thus can appropriately determine the switch state and in turn appropriately determine the state of the electrical actuator. Consequently, the controller has redundancy for successfully determining the state of the electrical actuator.

In the controller for the system according to a second aspect, the first control section outputs the command signal to the drive section and determines the switch state based on the command signal.

According to the second aspect, since the first control section outputs the command signal, a structure for outputting the command signal need not be provided in addition to the first and second control sections, leading to a simple system configuration. In addition, the first control section determines the switch state based on the command signal output by itself, and thus can appropriately determine the switch state without erroneously detecting the command signal.

In the controller for the system according to a third aspect, the first control section acquires the drive signal and determines whether a switch state indicated by the command signal is equal to or different from a switch state indicated by the drive signal, the second control section acquires the command signal and determines whether a switch state indicated by the command signal is equal to or different from a switch state indicated by the drive signal, and at least one of the first control section and the second control section determines the drive section to have some abnormality on the condition that at least one of the first and second control sections determines the switch states to be different from each other.

According to the third aspect, each control section acquires a signal unused for determination of the switch state in addition to a signal used for determination of the switch state, and determines whether the switch states indicated by such signals are equal to or different from each other. In the configuration, the drive section is determined to have some abnormality on the condition that at least one of the first and second control sections determines the switch states to be different from each other. Since the two control sections are thus used to determine the drive section to have some abnormality, abnormality detection accuracy can be improved.

In the controller for the system according to a fourth aspect, the system includes a cutoff section that forcibly switches the switch to the second state based on the cutoff signal, and at least one of the first control section and the second control section outputs the cutoff signal to the cutoff section when the drive section is determined to have some abnormality.

According to the fourth aspect, it is possible to control erroneous switching of the state of the electrical actuator by the drive section determined to have some abnormality.

In the controller for the system according to a fifth aspect, the electrical actuator is a relay switch provided on an electric path connecting a power supply unit and an electric load including a capacitor and performing pre-charge of the capacitor from the power supply unit at start of the electric load, the first control section determines that pre-charge has been completed when the switch is in the first state during a specified period, the second control section also determines that pre-charge has been completed when the switch is in the first state over the specified period, and at least one of the first control section and the second control section switches the switch to the second state on the condition that the first control section determines that pre-charge has been completed and the second control section also determines that pre-charge has been completed.

According to the fifth aspect, since the two control sections use the respective different signals to determine completion of pre-charge, it is possible to suppress a failure in operation of the electric load due to premature switching of the relay switch to the power cutoff state before completion of the pre-charge.

In the controller for the system according to a sixth aspect, the switch is a semiconductor switch, the drive signal is an analog signal received by a control terminal of the semiconductor switch, and the command signal is a binary signal that changes between two values of high and low.

According to the sixth aspect, the signals used in the two control sections are different in type, i.e., an analog signal and a binary signal such as a digital signal. This preferably provides redundancy.

First Embodiment

A first embodiment of a controller of the disclosure, in which the controller is applied to an onboard power supply system 100, will now be described with reference to the accompanying drawings.

As illustrated in FIG. 1, the power supply system 100 of the first embodiment includes a battery 10 as a power supply unit, an electric load 11, an SMR assembly 50, a first controller 60, and a second controller 61. The battery 10 is a chargeable and dischargeable battery, specifically an assembled battery including a plurality of lithium ion batteries 12 connected in series. The battery 10 may be another type of storage battery.

The electric load 11 includes a revolving armature 20, an inverter 30, and a smoothing capacitor 40. The revolving armature 20 is connected to the battery 10 through the inverter 30. The revolving armature 20 receives/transmits power from/to the battery 10 so that it receives power from the battery 10 to apply a driving force to a vehicle in power running, and generates power using deceleration energy of the vehicle and transmits the power to the battery 10 in regeneration. The smoothing capacitor 40 is connected in parallel with the inverter 30.

The SMR assembly 50 is provided on an electric path LD connecting the battery 10 and the electric load 11. The SMR assembly 50 is connected to the negative electrode of the battery 10 and switches an energizing state through the electrical path LD.

The SMR assembly 50 includes a first relay 51 and a second relay 53. The first relay 51 is a relay switch that performs pre-charge of the smoothing capacitor 40 from the battery 10 at start of the revolving armature 20. The first relay 51 is in series connection with a resistance element 52 that limits an inrush current during the pre-charge. In the first embodiment, the first relay 51 corresponds to "the electrical actuator".

The second relay 53 is a relay switch to feed power to the revolving armature 20 after the pre-charge. The second relay 53 is connected in parallel with the series connection of the first relay 51 and the resistance element 52.

The first and second relays 51 and 53 are each a normally open mechanical relay (contact relay) to operate a movable contact by magnetic force of a coil and elastic force of a spring. The respective first and second relays 51 and 53 therefore have first and second coils 51a and 53a to be excited upon energization and first and second switch sections 51b and 53b to be opened or closed by movable contacts moving in response to the excitation of the first and second coils 51a and 53a. The first and second relays 51 and 53 may each be a normally closed mechanical relay.

The first and second coils 51a and 53a are connected to first and second drive circuits 90 and 91, respectively. The first drive circuit 90 is connected to the first controller 60, and switches an excitation state of the first coil 51a according to a command from the first controller 60 and thus switches the first relay 51 between an on state (closed state) and an off state (open state). The second drive circuit 91 is connected to the second controller 61, and switches an excitation state of the second coil 53a according to a command from the second controller 61 and thus switches the second relay 53 between an on state and an off state. The first and second drive circuits 90 and 91 are described in detail later.

The first controller 60 is a known electronic controller having a microcomputer including CPU, ROM, RAM, and a flash memory. The first controller 60 acquires various signals and performs various types of control based on the acquired information. For example, the first controller 60 acquires battery information from a battery monitor 13 and switches a state of the first relay 51 based on the acquired battery information. Examples of the battery information include a charge-discharge current and an interterminal voltage.

The first drive circuit 90 and the first controller 60 are now described. Since the second drive circuit 91 and the second controller 61 have roughly the same configurations as those of the first drive circuit 90 and the first controller 60, respectively, duplicated description is omitted.

Figure 2:
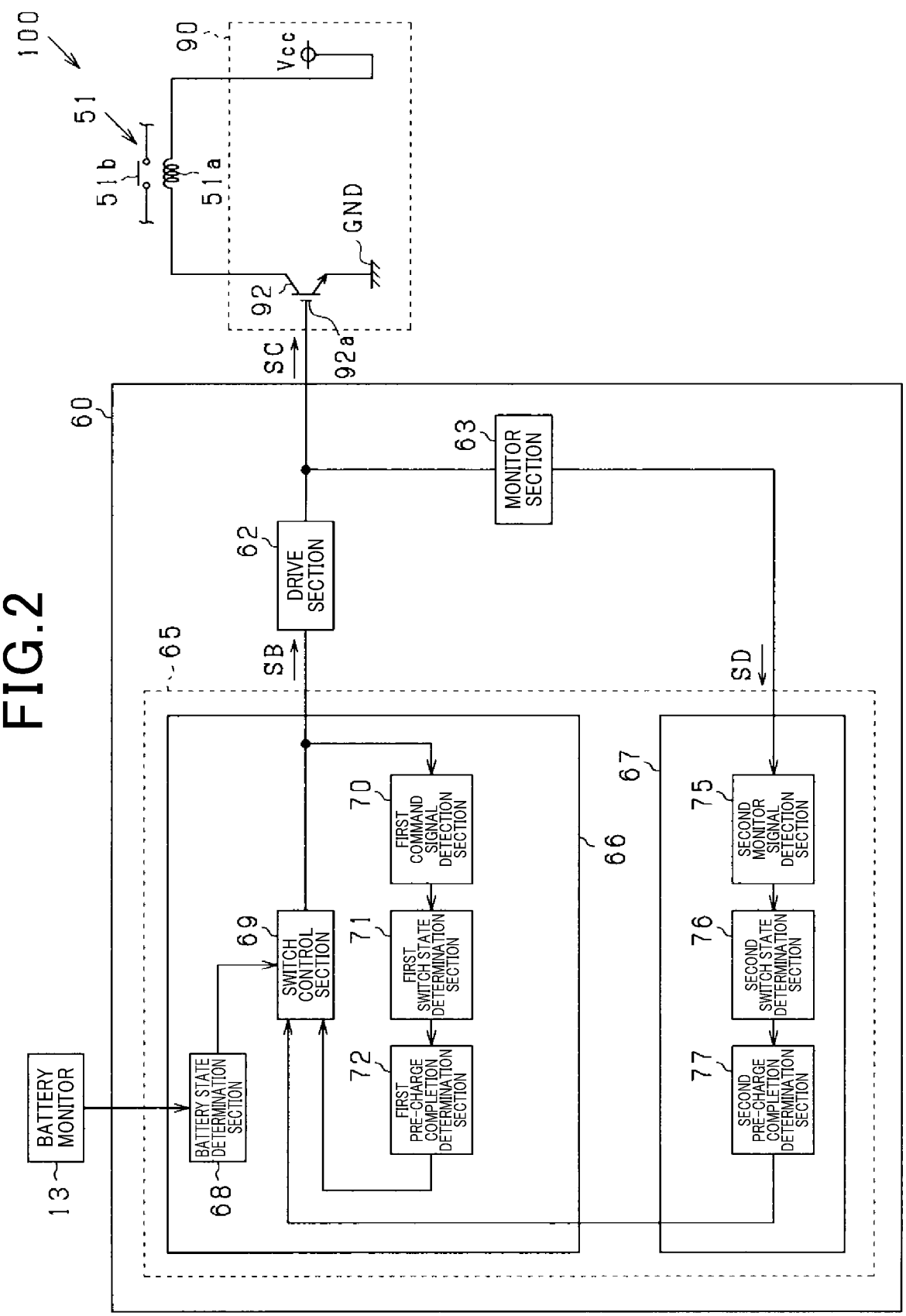
FIG. 2 is a block diagram schematically illustrating a first drive circuit and a first controller according to a first embodiment.

As illustrated in FIG. 2, the first drive circuit 90 connects the two respective ends of the first coil 51a to a power source Vcc and a ground terminal GND. The first drive circuit 90 has a switch 92 connected between the first coil 51a and the ground terminal GND. The switch 92 is a semiconductor switching element, for example, an insulated-gate bipolar transistor (IGBT). Alternatively, the switch 92 may be a metal-oxide semiconductor field-effect transistor (MOSFET).

The switch 92 is driven by a drive signal SC output from the first controller 60 so as to be switched between an on state and an off state. When the switch 92 is switched to the on state, the first coil 51a is excited and thus the first relay 51 is switched to an on state. As a result, power is supplied from the battery 10 to the smoothing capacitor 40 through the first relay 51 and charge is accumulated in the smoothing capacitor 40. When the switch 92 is switched to the off state, current flowing into the first coil 51a is cutoff and thus the first relay 51 is switched to an off state. Accordingly, power supply from the battery 10 to the smoothing capacitor 40 is cut off. That is, the switch 92 switches the first relay 51 between the power supply state and the power cutoff state. In the first embodiment, the on state corresponds to "the first state", and the off state corresponds to "the second state".

The first controller 60 includes a drive section 62, a monitor section 63, and a control section 65. The drive section 62 drives the switch 92. Specifically, the drive section 62 receives a command signal SB for switching of the switch 92 from the control section 65, and based on the command signal SB, sends the drive signal SC to drive the switch 92 to the switch 92.

The drive signal SC is received by a gate terminal 92a as a control terminal of the switch 92. The drive signal SC is an analog signal with a varying voltage value. When the voltage value of the drive signal SC is higher than a threshold voltage Vth of the switch 92, the switch 92 is switched to the on state. When the voltage value of the drive signal SC is lower than the threshold voltage Vth, the switch 92 is switched to the off state.

The monitor section 63 detects the drive signal SC output from the drive section 62. Specifically, the monitor section 63 detects the voltage value of the drive signal SC and outputs a monitor signal SD that has a first value when the detected voltage value is larger than a threshold and a second value different from the first value when the detected voltage value is equal to or smaller than the threshold, i.e., changes between the two values. The threshold is the threshold voltage Vth of the switch 92, for example.

The control section 65 includes a first control section 66 and a second control section 67. The first control section 66 includes a battery state determination section 68 and a switch control section 69. The battery state determination section 68 acquires battery information from the battery monitor 13 and determines a state of the battery 10 based on the acquired battery information. The battery 10 is in an overcharge/overdischarge state, for example. The switch control section 69 sends the command signal SB to the drive section 62 based on the state of the battery 10 determined by the battery state determination section 68.

The second control section 67 includes a monitor signal detection section 75, a switch state determination section 76, and a pre-charge completion determination section 77. The monitor signal detection section 75 detects the monitor signal SD output from the monitor section 63. The switch state determination section 76 determines a switch state 92 based on the monitor signal SD detected by the monitor signal detection section 75. Specifically, the switch state determination section 76 determines the switch 92 to be in the on state when the monitor signal SD has the first value and to be in the off state when the monitor signal SD has the second value.

The pre-charge completion determination section 77 determines the first relay 51 to be in the on state based on the switch state 92 determined by the switch state determination section 76 and thus determines completion of pre-charge of the smoothing capacitor 40. Specifically, the pre-charge completion determination section 77 measures a period during which the switch state determination section 76 determines the switch 92 to be in the on state, i.e., a period during which the first relay 51 is maintained in the on state, and determines that pre-charge has been completed if the first relay 51 is in the on state during a specified period TK.

Upon acquiring the pre-charge completion determination from the pre-charge completion determination section 77, the switch control section 69 switches the switch 92 to the off state through the drive section 62. The first relay 51 is accordingly switched to the off state. Subsequently, the second controller 61 switches the second relay 53 to the on state, and thus power is transferred between the revolving armature 20 and the battery 10 through the semiconductor switch as a component of the inverter 30.

Redundancy may be required for determination of the state of the first relay 51 in order to improve safety. For example, when the control section 65 determines the state of the first relay 51 based on only the monitor signal SD output from the monitor section 63, the control section erroneously determines the state of the first relay 51 when abnormality occurs in the monitor section 63. The first relay 51 is thus erroneously determined to be in the on state while actually in the off state and thus pre-charge is erroneously determined to be completed. This causes an inrush current from the battery 10, leading to short circuit between two main electrodes of the semiconductor switch as a component of the inverter 30, and in turn leading to abnormality such as welding between the two electrodes maintained in the on state.

To address the above difficulty, in the first embodiment, not only the second control section 67 but also the first control section 66 determines the state of the first relay 51. The first control section 66 determines the state of the first relay 51 based on the command signal SB different from the drive signal SC and thus has redundancy in state determination of the first relay 51.

Specifically, the first control section 66 includes a command signal detection section 70, a switch state determination section 71, and a pre-charge completion determination section 72. Hereinafter, for distinction, the switch state determination section 71 and the pre-charge completion determination section 72 in the first control section 66 are referred to as first switch state determination section 71 and first pre-charge completion determination section 72, respectively. In addition, the switch state determination section 76 and the pre-charge completion determination section 77 in the second control section 67 are referred to as second switch state determination section 76 and second pre-charge completion determination section 77, respectively.

The command signal detection section 70 detects the command signal SB output from the switch control section 69. Specifically, the command signal detection section 70 detects the command signal SB within the first control section 66. This reduces adverse effects of noise compared with a case where the command signal SB is detected outside the first control section 66.

The first switch state determination section 71 determines the switch state 92 based on the command signal SB detected by the command signal detection section 70. The command signal SB is a binary signal, for example, a digital signal, which becomes, for example, a "high" signal having a connection command value when the switch 92 is switched to the on state, and becomes, for example, a "low" signal having a cutoff command value different from the connection command value when the switch 92 is switched to the off state. The first switch state determination section 71 determines the switch 92 to be in the on state when the command signal SB has the connection command value, and to be in the off state when the command signal SB has the cutoff command value.

The first pre-charge completion determination section 72 determines the on state of the first relay 51 based on the switch state 92 determined by the first switch state determination section 71 and thus determines completion of pre-charge of the smoothing capacitor 40. Specifically, the first pre-charge completion determination section 72 measures a period during which the first switch state determination section 71 determines the switch 92 to be in the on state, i.e., a period during which the first relay 51 is maintained in the on state, and determines completion of pre-charge if the first relay 51 is in the on state over the specified period TK. Hereinafter, the pre-charge completion determination by the first pre-charge completion determination section 72 is referred to as completion provisional determination. The same holds true for the second pre-charge completion determination section 77.

The first control section 66 performs completion determination processing for determining completion of pre-charge based on both the completion provisional determination by the first pre-charge completion determination section 72 and the second pre-charge completion provisional determination. The first control section 66 thus determines completion of pre-charge using not only completion provisional determination acquired from the second control section 67 but also completion provisional determination determined by itself. These completion provisional determinations are made based on the respective different signals. This provides redundancy for successful determination of completion of pre-charge, which suppresses erroneous determination of completion of pre-charge.

Figure 3A:
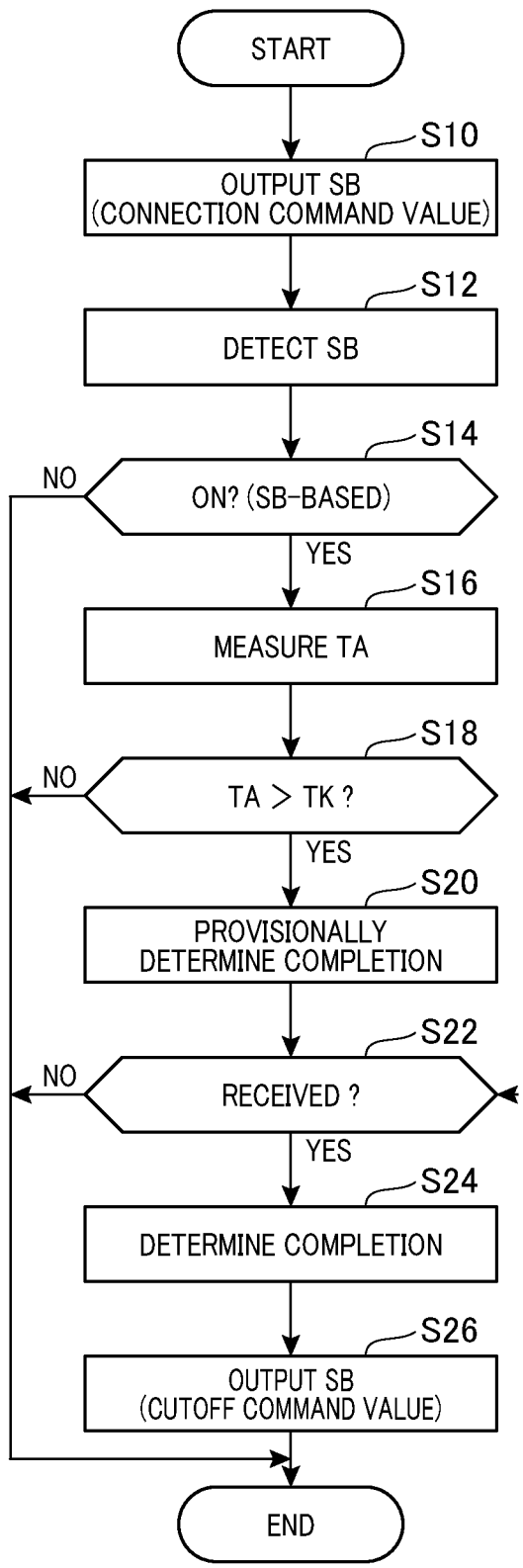
FIGS. 3A and 3B show flowcharts illustrating completion determination processing and completion provisional-determination processing, respectively, of the first embodiment.
Figure 3B:
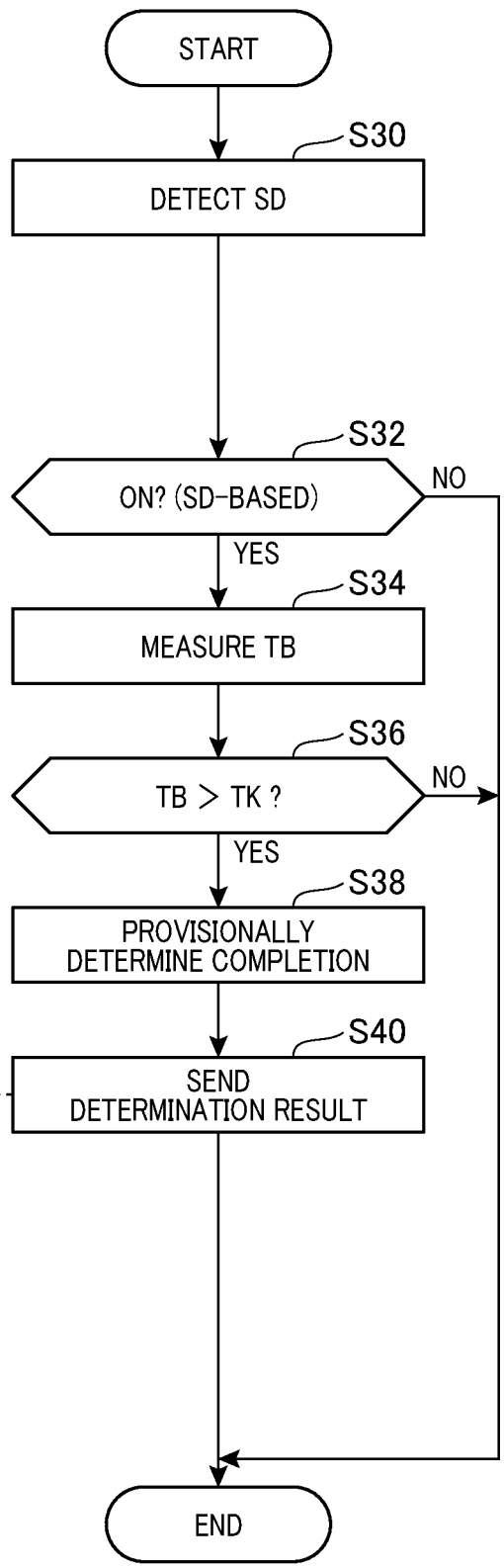

FIGS. 3A and 3B show flowcharts of the completion determination processing and the completion provisional-determination processing, respectively, of the first embodiment. The completion provisional-determination processing is for the completion provisional determination performed by the second control section 67. FIG. 3A shows the flowchart illustrating the completion determination processing by the first control section 66, and FIG. 3B show the flowchart illustrating the completion provisional-determination processing by the second control section 67. Each of the first and second control sections 66 and 67 repeats the processing at every start of the revolving armature 20.

The completion provisional-determination processing by the second control section 67 is now described. After starting the completion provisional-determination processing, the second control section 67 detects the monitor signal SD using the monitor signal detection section 75 in step S30. Subsequently, in step S32, the second control section 67 uses the second switch state determination section 76 to determine whether the switch 92 is in the on state based on the monitor signal SD detected in step S30.

In the case of negative determination in step S32, the second control section 67 finishes the completion provisional-determination processing. In the case of positive determination in step S32, in step S34, the second control section 67 uses the second pre-charge completion determination section 77 to measure elapsed time TB, i.e., elapsed time from determination of the on state in step S32. Subsequently, in step S36, the second control section 67 determines whether the elapsed time TB is longer than the specified period TK.

In the case of negative determination in step S36, the second control section 67 finishes the completion provisional-determination processing. In the case of positive determination in step S36, in step S38, the second control section 67 provisionally determines completion of pre-charge. Subsequently, in step S40, the second control section 67 sends such a provisional determination result to the switch control section 69 of the first control section 66 and finishes the completion provisional-determination processing.

The completion determination processing by the first control section 66 is now described. After starting the completion determination processing, in step S10, the first control section 66 uses the switch control section 69 to output the command signal SB having the connection command value. Subsequently, in step S12, the first control section 66 detects the command signal SB using the command signal detection section 70.

In step S14, the first control section 66 uses the first switch state determination section 71 to determine whether the switch 92 is in the on state based on the command signal SB detected in step S12. That is, the first control section 66 determines the switch state 92 based on the command signal SB output in step S10.

In the case of negative determination in step S14, the first control section 66 finishes the completion determination processing. In the case of positive determination in step S14, in step S16, the first control section 66 uses the first pre-charge completion determination section 72 to measure elapsed time TA, i.e., elapsed time from determination of the on state in step S14. Subsequently, in step S18, the first control section 66 determines whether the elapsed time TA is longer than the specified period TK.

In the case of negative determination in step S18, the first control section 66 finishes the completion determination processing. In the case of positive determination in step S18, the first control section 66 provisionally determines completion of pre-charge in step S20. Subsequently, in step S22, the first control section 66 uses the switch control section 69 to determine whether the provisional-determination result is acquired from the second control section 67.

In step S22, the first control section 66 continues the determination over reference time TC in consideration of time lag before each of the first control section 66 and the second control section 67 makes the completion provisional determination. Examples of causes of the time lag include a period for conversion from the command signal SB to the drive signal SC in the drive section 62 and a period for conversion from the drive signal SC to the monitor signal SD in the monitor section 63.

In the case of negative determination in step S22, the first control section 66 finishes the completion determination processing. In the case of positive determination in step S22, the first control section 66 determines completion of pre-charge in step S24. Specifically, the first control section 66 determines completion of pre-charge on the condition that the first control section 66 provisionally determines completion of pre-charge and the second control section 67 also provisionally determines completion of pre-charge. Subsequently, in step S26, the first control section 66 outputs a command signal SB having the cutoff command value and finishes the completion determination processing.

According to the first embodiment as described in detail above, the following effects are provided.

In the first embodiment, the first controller 60 includes the first control section 66 and the second control section 67, and the first control section 66 determines the switch state 92 based on the command signal SB to provisionally determine completion of pre-charge. The second control section 67 determines the switch state 92 based on the monitor signal SD to provisionally determine completion of pre-charge. The first control section 66 determines completion of pre-charge on the condition that the first control section 66 provisionally determines completion of pre-charge and the second control section 67 also provisionally determines completion of pre-charge, and switches the switch 92 to the off state. The first relay 51 is accordingly switched to the off state, leading to cutoff of power supply from the battery 10 to the smoothing capacitor 40.

According to such a configuration, the two control sections 66 and 67 use the respective different signals SB and SD to determine completion of pre-charge. Hence, for example, even if the second control section 67 fails to appropriately acquire the monitor signal SD due to abnormality in at least one of the drive section 62 and the monitor section 63 and thus erroneously determines completion of pre-charge, the first control section 66 can appropriately acquire the command signal SB and thus appropriately determine completion of pre-charge. As a result, the first control section 66 has redundancy for successfully determining completion of pre-charge. It is therefore possible to suppress erroneous determination of completion of pre-charge, and suppress occurrence of abnormality caused by the erroneous determination, for example, welding between the two electrodes of the semiconductor switch as a component of the inverter 30.

In the first embodiment, the first control section 66 determines the switch state 92 based on the command signal SB output by itself. The first control section 66 therefore can acquire the command signal SB within the first control section 66 itself, and thus can suppress erroneous detection of the command signal SB due to noise or the like and appropriately determine the switch state 92.

Second Embodiment

Figure 4:
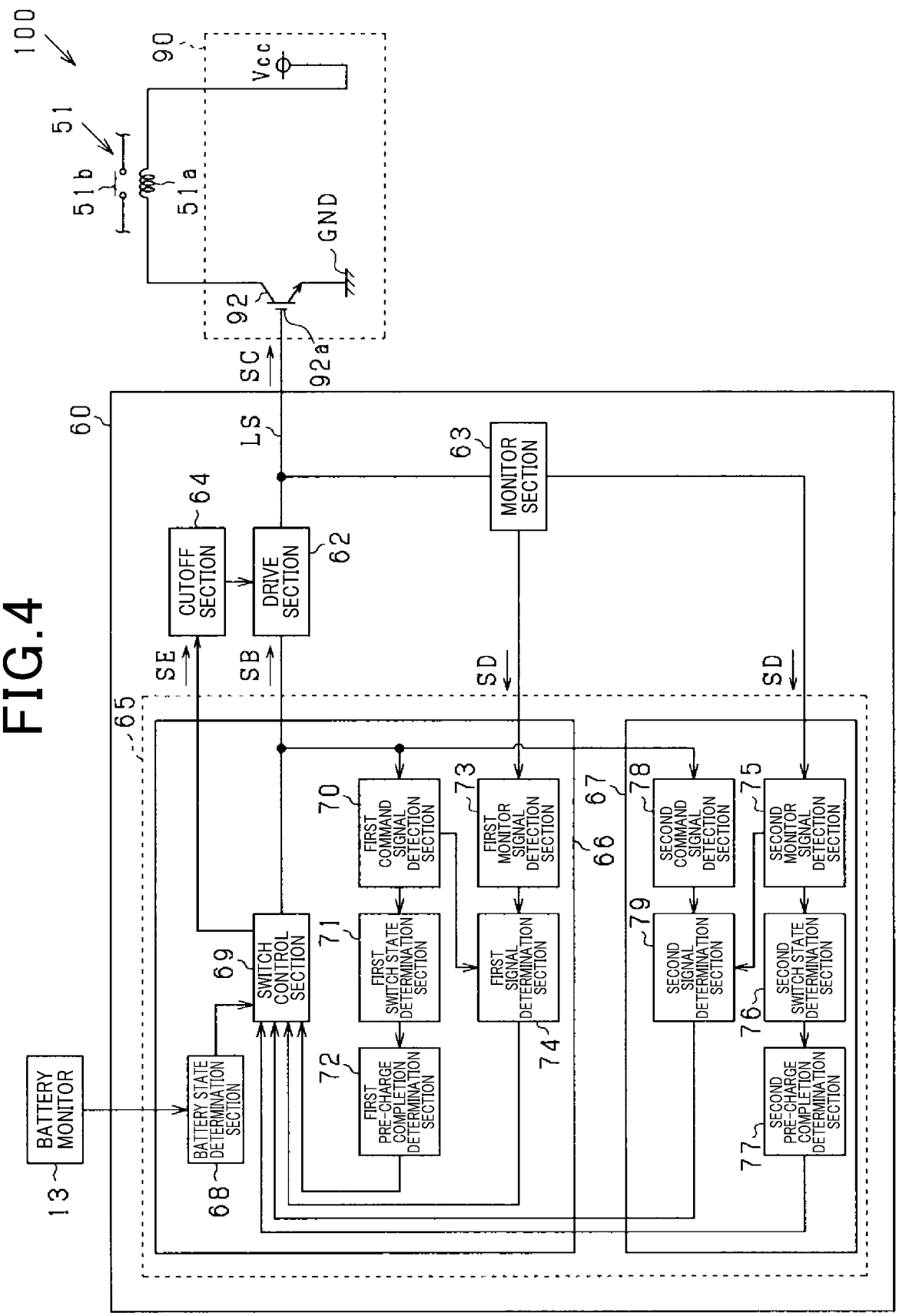
FIG. 4 is a block diagram schematically illustrating a first drive circuit and a first controller according to a second embodiment.

A second embodiment is now described with reference to FIGS. 4 to 6B mainly on the differences from the first embodiment. In FIG. 4, the same reference numerals are designated to the same processing as the configuration shown in FIG. 2 for convenience, and duplicated description is omitted.

As illustrated in FIG. 4, the second embodiment is different from the first embodiment in that the first controller 60 includes a cutoff section 64. The cutoff section 64 receives a cutoff signal SE from the control section 65, and the switch 92 is forcibly switched to the off state based on the cutoff signal SE. Specifically, the drive section 62 has a cutoff switch connected to an electric path LS connecting the drive section 62 and the switch 92. Specifically, the cutoff switch cuts off the drive signal SC output from the drive section 62 to the electric path LS. When acquiring the cutoff signal SE, the cutoff section 64 switches the cutoff switch to the off state while the cutoff switch is normally maintained in the on state. As a result, the switch 92 is switched to the off state.

The second embodiment is further different from the first embodiment in that the first control section 66 includes a monitor signal detection section 73 and a signal determination section 74, and the second control section 67 includes a command signal detection section 78 and a signal determination section 79. Hereinafter, for distinction, the command signal detection section 70, the monitor signal detection section 73, and the signal determination section 74 in the first control section 66 are referred to as first command signal detection section 70, first monitor signal detection section 73, and first signal determination section 74, respectively. Similarly, the monitor signal detection section 75, the command signal detection section 78, and the signal determination section 79 in the second control section 67 are referred to as second monitor signal detection section 75, second command signal detection section 78, and second signal determination section 79, respectively.

The first monitor signal detection section 73 detects the monitor signal SD output from the monitor section 63. The first signal determination section 74 determines whether a switch state 92 indicated by the command signal SB detected by the first command signal detection section 70 is equal to or different from a switch state 92 indicated by the monitor signal SD detected by the first monitor signal detection section 73.

The second command signal detection section 78 detects the command signal SB output from the switch control section 69. The second signal determination section 79 determines whether a switch state 92 indicated by the command signal SB detected by the second command signal detection section 78 is equal to or different from a switch state 92 indicated by the monitor signal SD detected by the second monitor signal detection section 75.

The first control section 66 performs abnormality determination processing for determining whether at least one of the drive section 62 and the monitor section 63 has some abnormality based on both the comparison result by the first signal determination section 74 and the comparison result by the second signal determination section 79. The first control section 66 thus determines whether at least one of the drive section 62 and the monitor section 63 has some abnormality using not only the comparison result acquired from the second control section 67 but also the comparison result made by the first control section 66 itself. This improves accuracy of the abnormality detection.

Figure 5A:
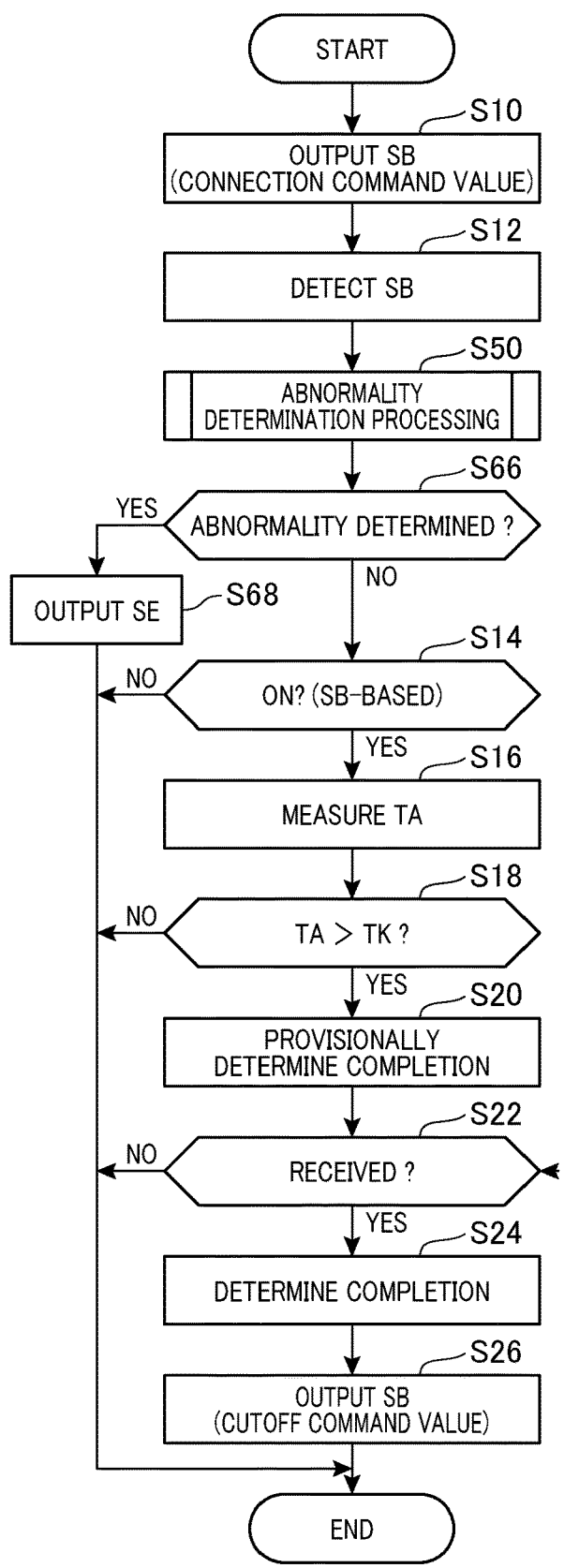
FIGS. 5A and 5B show flowcharts illustrating completion determination processing and completion provisional-determination processing, respectively, of the second embodiment.
Figure 5B:
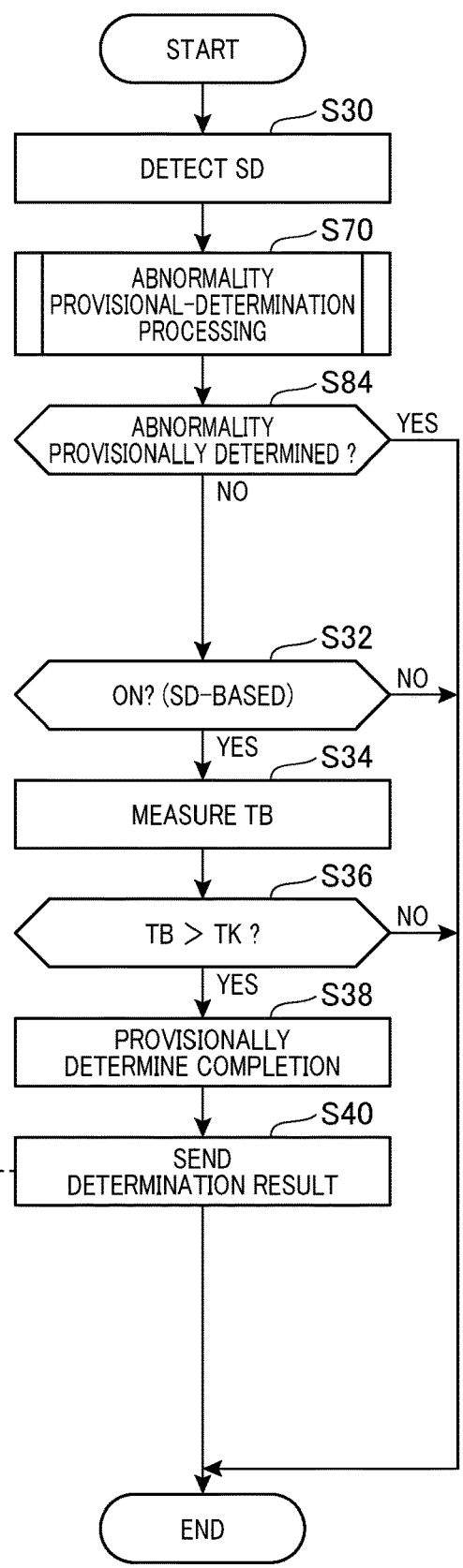

Specifically, the first control section 66 performs the abnormality determination processing in the completion determination processing. The second control section 67 performs abnormality provisional-determination processing in the completion provisional-determination processing. FIGS. 5A and 5B show flowcharts of the completion determination processing and the completion provisional-determination processing, respectively, of the second embodiment. In FIGS. 5A and 5B, the same step number is used for the same processing as in FIGS. 3A and 3B for convenience, and duplicated description is omitted.

FIG. 5B shows a flowchart of the completion provisional-determination processing of the second embodiment. In the completion provisional-determination processing of the second embodiment, upon detection of the monitor signal SD in step S30, the second control section 67 performs the abnormality provisional-determination processing in step S70.

Figure 6A:
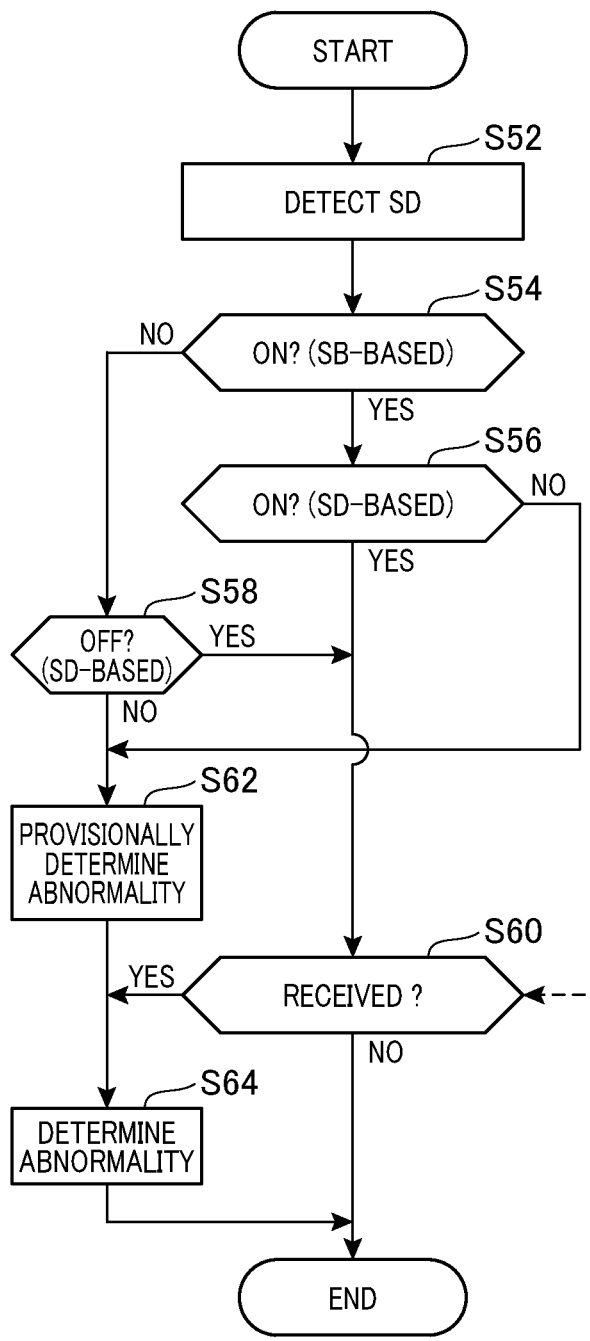
FIGS. 6A and 6B show flowcharts illustrating abnormality determination processing and abnormality provisional-determination processing, respectively.
Figure 6B:
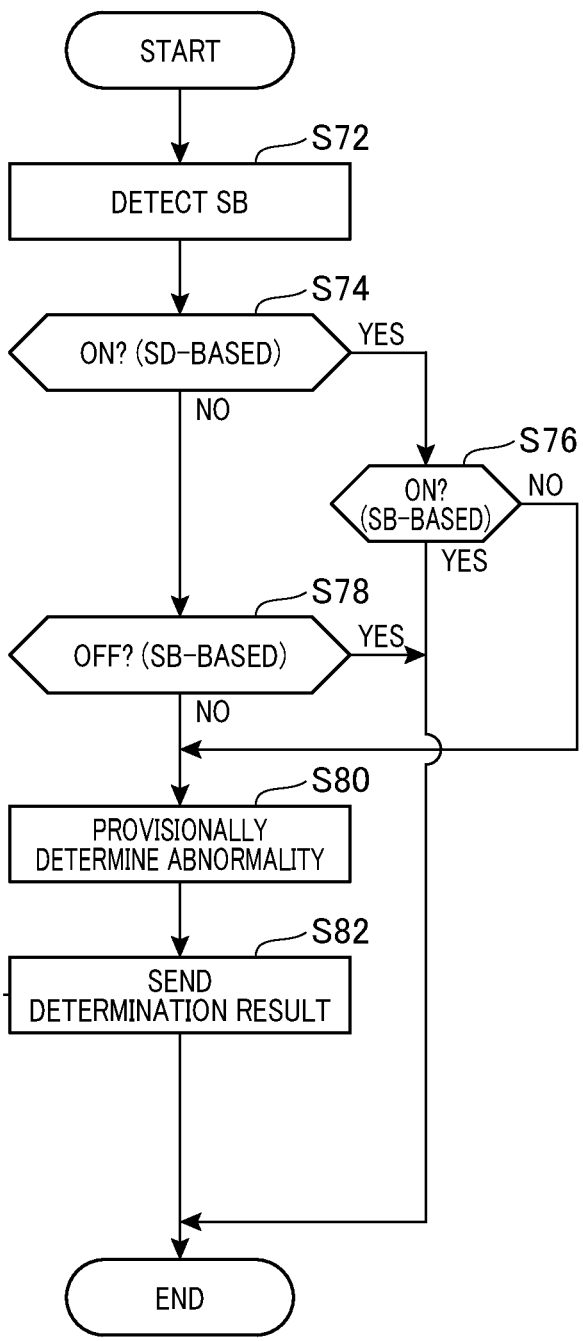

FIG. 6B shows a flowchart of the abnormality provisional-determination processing. After starting the abnormality provisional-determination processing, the second control section 67 detects the command signal SB using the second command signal detection section 78 in step S72. Subsequently, in step S74, the second control section 67 uses the second signal determination section 79 to determine whether the switch 92 is in the on state based on the monitor signal SD detected in step S30.

In the case of positive determination in step S74, in step S76, the second control section 67 determines whether the switch 92 is in the on state based on the command signal SB detected in step S72. In the case of negative determination in step S74, in step S78, the second control section 67 determines whether the switch 92 is in the off state based on the command signal SB detected in step S72.

In the case of positive determination in step S76 or S78, that is, in the case where the signals SB and SD indicate the same switch state 92, the second control section 67 finishes the abnormality provisional-determination processing. In the case of negative determination in step S76 or S78, that is, in the case where the respective signals SB and SD indicate different states of the switch 92, in step S80, the second control section 67 provisionally determines whether at least one of the drive section 62 and the monitor section 63 has some abnormality. Subsequently, in step S82, the second control section 67 sends such a provisional determination result to the switch control section 69 of the first control section 66 and finishes the abnormality provisional-determination processing.

After finishing the abnormality provisional-determination processing, the second control section 67 returns to the completion provisional-determination processing illustrated in FIG. 5B and determines, in step S84, whether abnormality provisional-determination is made in the abnormality provisional-determination processing. In the case of positive determination in step S84, the second control section 67 finishes the completion provisional-determination processing. In the case of negative determination in step S84, the second control section 67 advances to step S32.

FIG. 5A shows a flowchart of the completion determination processing of the second embodiment. In the completion determination processing of the second embodiment, upon detection of the command signal SB in step S12, the first control section 66 performs abnormality determination processing in step S50.

FIG. 6A shows a flowchart of the abnormality determination processing. After starting the abnormality determination processing, the first control section 66 detects the monitor signal SD using the first monitor signal detection section 73 in step S52. Subsequently, in step S54, the first control section 66 uses the first signal determination section 74 to determine whether the switch 92 is in the on state based on the command signal SB detected in step S12.

In the case of positive determination in step S54, in step S56, the first control section 66 determines whether the switch 92 is in the on state based on the monitor signal SD detected in step S52. In the case of negative determination in step S54, in step S58, the first control section 66 determines whether the switch 92 is in the off state based on the monitor signal SD detected in step S52.

In the case of positive determination in step S56 or S58, that is, in the case where the signals SB and SD indicate the same switch state 92, in step S60, the first control section 66 uses the switch control section 69 to determine whether the determination result is acquired from the second control section 67. In step S60, the first control section 66 continues the determination over the reference time TC as in step S22. In the case of negative determination in step S60, the first control section 66 finishes the abnormality determination processing.

In the case of positive determination in step S60, in step S64, the first control section 66 determines whether at least one of the drive section 62 and the monitor section 63 has some abnormality and finishes the abnormality determination processing.

In the case of negative determination in step S56 or S58, that is, in the case where the respective signals SB and SD indicate different states of the switch 92, in step S62, the first control section 66 provisionally determines whether at least one of the drive section 62 and the monitor section 63 has some abnormality, and advances to step S64. That is, in the abnormality determination processing, when at least one of the first control section 66 and the second control section 67 provisionally determines whether at least one of the drive section 62 and the monitor section 63 has some abnormality, such abnormality is determined to be present.

After finishing the abnormality determination processing, the first control section 66 returns to the completion determination processing illustrated in FIG. 5A and determines, in step S66, whether abnormality is determined in the abnormality determination processing. In the case of positive determination in step S66, in step S68, the first control section 66 uses the switch control section 69 to output the cutoff signal SE to the cutoff section 64, and finishes the completion determination processing. In the case of negative determination in step S66, the first control section 66 advances to step S14.

According to the second embodiment as described above, the first control section 66 detects the monitor signal SD unused for provisional determination of completion of pre-charge, and uses the monitor signal SD and the command signal SB to provisionally determine at least one of the drive section 62 and the monitor section 63 to have some abnormality. The second control section 67 detects the command signal SB unused for provisional determination of completion of pre-charge, and uses the command signal SB and the monitor signal SD to provisionally determine at least one of the drive section 62 and the monitor section 63 to have some abnormality. The first control section 66 determines whether at least one of the drive section 62 and the monitor section 63 has some abnormality on the condition that at least one of the control sections 66 and 67 determines the abnormality.

According to such a configuration, since the two control sections 66 and 67 are used to determine at least one of the drive section 62 and the monitor section 63 to have some abnormality, accuracy of the abnormality detection can be improved.

In the second embodiment, when at least one of the drive section 62 and the monitor section 63 is determined to have some abnormality, the switch 92 is forcibly switched to the off state. This makes it possible to suppress erroneous switching of the state of the first relay 51 due to that configuration determined to be abnormal.

OTHER EMBODIMENTS

The above-described respective embodiments may be modified and implemented as follows.

The above-described respective embodiments have been described with an exemplary configuration where the first controller 60 includes the drive section 62 and the monitor section 63, but are not limited to this. For example, the drive section 62 and the monitor section 63 may be provided outside the first controller 60 so that the first controller 60 includes only the first control section 66 and the second control section 67.

The above-described respective embodiments have been described with an exemplary configuration where the control sections 66 and 67 include the pre-charge completion determination sections 72 and 77, respectively, and the first control section 66 determines completion of pre-charge, but are not necessarily limited to the configuration. For example, the control sections 66 and 67 may not include the pre-charge completion determination sections 72 and 77, respectively.

In such a case, the first control section 66 determines the switch state 92 based on the command signal SB. The second control section 67 determines the switch state 92 based on the monitor signal SD. The first control section 66 may determine the first relay 51 to be in the on state, i.e., in the power supply state on the condition that the first control section 66 determines the switch 92 to be in the on state and the second control section 67 also determines the switch 92 to be in the on state.

According to such a configuration, the two control sections 66 and 67 use the respective different signals SB and SD to determine the state of the first relay 51. This provides redundancy for successful determination of the state of the first relay 51.

The above-described respective embodiments have been described with an exemplary configuration where the first controller 60 includes the monitor section 63, but are not necessarily limited to the configuration. For example, the second control section 67 may have a function of the monitor section 63. In such a case, the first control section 66 determines the switch state 92 based on the command signal SB, while the second control section 67 determines the switch state 92 based on the drive signal SC.

In such a case, the two signals SB and SC to determine the switch state 92 are different in type, i.e., a binary signal and an analog signal, respectively. This preferably provides redundancy for determining the switch state 92.

Although the first embodiment has been described with an exemplary configuration where the first control section 66 determines completion of pre-charge, the second control section 67 may determine completion of pre-charge instead.

Although the second embodiment has been described with an exemplary configuration where the first control section 66 determines completion of pre-charge and further determines whether at least one of the drive section 62 and the monitor section 63 has some abnormality, the second control section 67 may make one of such determinations.

For example, the second control section 67 may solely determine at least one of the drive section 62 and the monitor section 63 to have some abnormality. In such a case, the second control section 67 may output the cutoff signal SE to the cutoff section 64.

Although the above-described respective embodiments have been described with an exemplary configuration where the SMR assembly 50 is connected to the negative electrode of the battery 10, the SMR assembly 50 may be connected to the positive electrode of the battery 10. Further, the SMR assembly 50 may be connected to the negative electrode of the battery 10 while a third relay different from the SMR assembly 50 is connected to the positive electrode.

For example, the third relay may be switched between the on state and the off state by the first controller 60. In such a case, the on state of the third relay may be determined together with the on state of the first relay 51 in at least one of the completion determination processing and the completion provisional-determination processing so that completion of pre-charge is determined based on such determination results.

What is claimed is:

1. A controller for a system, the controller comprising:
a first control section; and
a second control section, wherein
the system includes an electrical actuator, a switch switching the electrical actuator between a power supply state and a power cutoff state, and a drive section driving the switch,
the electrical actuator being in the power supply state when the switch is in a first one of an open state and a closed state and in the power cutoff state when the switch is in a second one of the open and closed states,
the first one of the open state and the closed state is defined as a first state and the second one of the open and closed states is defined as a second state,
the drive section outputs, to the switch, a drive signal to drive the switch based on a command signal for switching of the switch,
the first control section determines a switch state based on the command signal,
the second control section determines the switch state based on the drive signal, and
at least one of the first control section and the second control section determines the electrical actuator to be in the power supply state on the condition that the first control section determines the switch to be in the first state and the second control section also determines the switch to be in the first state.

2. The controller according to claim 1, wherein
the first control section outputs the command signal to the drive section and determines the switch state based on the command signal.

3. The controller according to claim 1, wherein
the first control section acquires the drive signal and determines whether the switch state indicated by the command signal is equal to or different from the switch state indicated by the drive signal,
the second control section acquires the command signal and determines whether the switch state indicated by the command signal is equal to or different from the switch state indicated by the drive signal, and
at least one of the first control section and the second control section determines the drive section to have some abnormality on the condition that at least one of the first control section and the second control section determines the switch states to be different from each other.

4. The controller according to claim 3, wherein
the system includes a cutoff section that forcibly switches the switch to the second state based on a cutoff signal, and
at least one of the first control section and the second control section outputs the cutoff signal to the cutoff section when the drive section is determined to have some abnormality.

5. The controller according to claim 1, wherein
the electrical actuator is a relay switch provided on an electric path connecting a power supply unit and an electric load including a capacitor and performing pre-charge of the capacitor from the power supply unit at start of the electric load,
the first control section determines that pre-charge has been completed when the switch is in the first state during a specified period, the second control section determines that pre-charge has been completed when the switch is in the first state over the specified period, and at least one of the first control section and the second control section switches the switch to the second state on the condition that the first control section determines that pre-charge has been completed and the second control section also determines that pre-charge has been completed.

6. The controller according to claim 1, wherein the switch is a semiconductor switch element, the drive signal is an analog signal received by a control terminal of the semiconductor switching element, and the command signal is a binary signal that changes between two values of high and low.

* * * * *